(12) United States Patent
Chen et al.

(10) Patent No.: US 8,222,731 B2
(45) Date of Patent: *Jul. 17, 2012

(54) CUT-OUT HEAT SLUG FOR INTEGRATED CIRCUIT DEVICE PACKAGING

(75) Inventors: Chia-Chun Chen, N.E.P.Z. Kaohsiung (TW); Kuo-Wen Peng, N.E.P.Z. Kaohsiung (TW); Ker-Chang Hsieh, N.E.P.Z. Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/647,093

(22) Filed: Dec. 24, 2009

(65) Prior Publication Data

US 2010/0096742 A1 Apr. 22, 2010

Related U.S. Application Data

(63) Continuation of application No. 11/579,890, filed as application No. PCT/IB2005/051531 on May 10, 2005, now Pat. No. 7,656,029.

(60) Provisional application No. 60/570,251, filed on May 11, 2004.

(51) Int. Cl.
  *H01L 23/34* (2006.01)

(52) U.S. Cl. ............... 257/712; 257/E23.101

(58) Field of Classification Search ........... 257/706, 257/712, 720, E23.101, 690
See application file for complete search history.

(56) References Cited

U.S. PATENT DOCUMENTS

| 6,191,360 | B1 | 2/2001 | Tao et al. | |
| 6,432,749 | B1 | 8/2002 | Libres | |
| 6,552,428 | B1 | 4/2003 | Huang | |
| 7,141,886 | B2 | 11/2006 | Dimaano et al. | |
| 7,161,092 | B2 * | 1/2007 | Glovatsky | 174/522 |
| 7,173,341 | B2 * | 2/2007 | Ho et al. | 257/778 |
| 7,180,166 | B2 * | 2/2007 | Ho et al. | 257/686 |

(Continued)

FOREIGN PATENT DOCUMENTS

DE  10038120  10/2001

(Continued)

OTHER PUBLICATIONS

Japanese Patent Office, Office Action mailed Dec. 14, 2010, Application No. 2007-512693, 2 pages.

(Continued)

*Primary Examiner* — Nathan Ha
(74) *Attorney, Agent, or Firm* — Haynes and Boone, LLP

(57) ABSTRACT

In a package, a heat slug, encapsulated by molding compound, encases an integrated circuit device (IC). In an example embodiment, a semiconductor package structure comprises a substrate having conductive traces and pad landings. The conductive traces have pad landings. An IC is mounted on the substrate. The IC has bonding pads. With conductive wires, the IC bonding pads are connected to the pad landings, which in turn, are connected to the conductive traces. A heat slug, having predetermined height, is disposed on the substrate surface. The heat slug includes a plurality of mounting feet providing mechanical attachment to the substrate. A cavity in the heat slug accommodates the IC. A plurality of first-size openings surrounds the IC. A second-size opening constructed from one of the first size-openings, is larger than the first-size opening. The second size-opening facilitates the introduction of molding compounds into the cavity of the heat slug.

10 Claims, 4 Drawing Sheets

U.S. PATENT DOCUMENTS

| | | |
|---|---|---|
| 7,342,304 B2 | 3/2008 | Huang |
| 2006/0166397 A1 | 7/2006 | Lau et al. |
| 2007/0200207 A1 | 8/2007 | Ramos et al. |
| 2007/0200210 A1 | 8/2007 | Zhao et al. |
| 2007/0290322 A1 | 12/2007 | Zhao et al. |

FOREIGN PATENT DOCUMENTS

| | | |
|---|---|---|
| JP | 08139223 | 5/1996 |
| JP | 11163229 | 6/1999 |
| JP | 2000151083 | 5/2000 |
| JP | 2001102495 | 4/2001 |
| JP | 2002151633 | 5/2002 |
| JP | 3101038 | 10/2003 |
| TW | 465806 | 8/1988 |
| TW | 465804 | 9/1989 |
| WO | WO-2004/002003 | 12/2003 |

OTHER PUBLICATIONS

Taiwanese Patent Office, Office Action dated Dec. 26, 2011, Application No. 094114783, 6 pages.

* cited by examiner

CUT-OUT HEAT SLUG FOR INTEGRATED CIRCUIT DEVICE PACKAGING

PRIORITY DATA

This application is a Continuation of U.S. patent application Ser. No. 11/579,890 filed on Aug. 16, 2007, which is a National Phase of International Application No. PCT/IB2005/051531 filed May 10, 2005, which claims the benefit of Provisional Application Ser. No. 60/570,251 filed on May 11, 2004, the entire disclosures of which are incorporated herein by reference.

The invention relates to semiconductor processing. More particularly this invention relates to the encapsulation of integrated circuit (IC) devices with a molding compound in high performance packages.

The electronics industry continues to rely upon advances in semiconductor technology to realize higher-function devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices has been manufactured having various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

U.S. Pat. No. 6,552,428 B1 of Huang et al titled, "Semiconductor Package Having an Exposed Heat Spreader," relates to semiconductor packages and more, particularly, to a ball grid array (BGA) semiconductor package having a heat spreader for effectively performing heat dissipation.

U.S. Pat. No. 6,432,749 B1 of Libres titled, "Method of Fabricating Flip-Chip IC Packages with Heat Spreaders in Strip Format," relates generally to a method of fabricating plastic encapsulated integrated circuits and more specifically to flip-chip devices with heat spreaders.

U.S. Pat. No. 6,191,360 B1 of Tao et al. titled, "Thermally Enhanced BGA Package," relates generally to an encapsulated BGA and more particularly to a flip-chip packaging having a thermally conductive member encapsulated with the chip. This and the previous references are incorporated by reference in their entirety.

For a given technology, an important aspect of IC manufacturing is the packaging of finished die and providing sufficient cooling. In a particular family of packages, for example, High-Performance Ball Grid Arrays (HBGA), these packages are designed for high power applications. The high power dissipation necessitates adequate cooling of the active IC device. Insufficient cooling results in reduced reliability. Using a heat slug provides cooling. The heat slug placed over the IC device and attached to the package substrate. A molding compound is then injected into space between the device die and the heat slug. The molding compound encapsulates the device die and aids in adhesion of the heat slug to the package substrate.

During the molding process, stresses to the heat slug and to its attachment to the package substrate may cause cracking. This cracking may allow foreign contaminants to enter the IC device as the device encapsulation/seal is compromised or worse, break electrical connections from the device's bonding pads to the pad landings of the HBGA. Such breakage reduces yield and significantly increases costs. There exists a need for a heat slug that overcomes these shortcomings.

In an example embodiment, a semiconductor package structure comprises a substrate. The substrate has conductive traces and the traces have pad landings. An integrated circuit device (IC) is mounted on the substrate; the IC has bonding pads and a plurality of conductive wires connecting the IC bonding pads with the pad landings connected to the traces. A heat slug having a predetermined height is disposed on the surface of the substrate. The heat slug includes a plurality of mounting feet. The mounting feet provide mechanical attachment of the heat slug to the substrate. The heat slug further includes a cavity to accommodate the IC device, a plurality of first-size openings, the plurality of first-size openings surrounding the IC device, and a second-size opening the second size opening constructed from one of the first-size openings the second-size opening being larger than the first-size opening. The second-size opening facilitates the introduction of molding compound into the cavity of the heat slug. A feature of this embodiment, further includes additional mounting feet located in the vicinity of the second size opening.

In another example embodiment, there is a method of bonding an integrated circuit die (IC) to a substrate. The method comprises, placing the IC on the substrate. After placing the IC on the substrate, the IC is attached. The IC is wire bonded to the substrate. A heat slug is disposed over the IC and the heat slug is attached to the substrate. The heat slug includes a plurality of mounting feet, providing mechanical attachment of the heat slug to the substrate, a cavity to accommodate the IC device, a plurality of first-size openings surrounding the IC, and a second-size opening constructed from one off the first-size openings the second-size. The second size opening facilitates the introduction of molding compound into the cavity of the heat slug. After the heat slug is attached to the substrate, molding compound is injected into the second size opening of the heat slug.

The above summaries of the present invention are not intended to represent each disclosed embodiment, or every aspect, of the present invention. Other aspects and example embodiments are provided in the figures and the detailed description that follows.

The invention may be more completely understood in consideration of the following detailed description of various embodiments of the invention in connection with the accompanying drawings, in which.

Figure 1A:
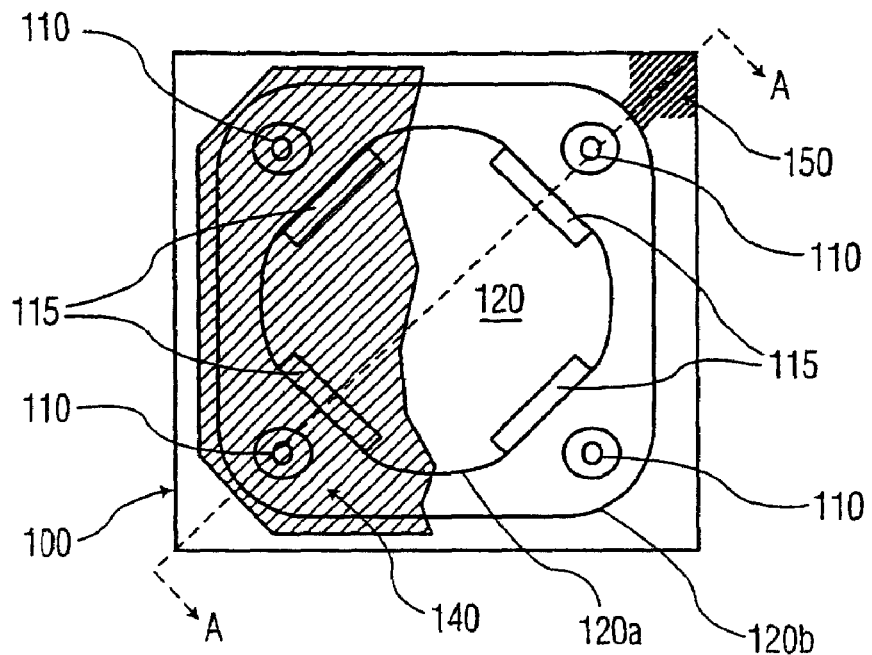
FIG. 1A (Prior Art) illustrates in top view a prior art heat slug.

The present invention has been found to be useful in overcoming challenges associated with the packaging of IC devices in HBGA packages. In an example substrate, a prior art heat slug (Refer to FIG. 1A) may undergo too much stress as the molding compound is injected through the openings 115. The pressure of injecting the molding compound (guided by the mold 140) may cause one or more mounting feet 110 of the heat slug 120 to lift off of substrate 100. In one example process, these mounting feet 110 are glued onto the substrate 100.

Figure 1B:
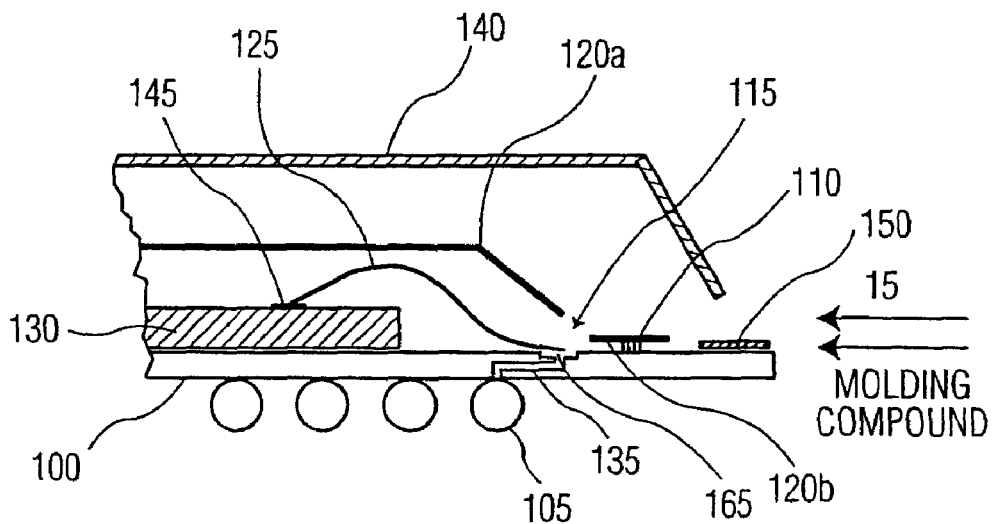
FIG. 1B is a cross-section of the heat slug of FIG. 1A.

As indicated in FIG. 1B, the molding compound 15 (guided by the mold 140) may not properly flow through via ports 115 to the IC device 130 encased by the heat slug 120. On the substrate 100, there is a landing 150 from which the molding compound's flow begins into the heat slug 120 and mold 140. The improper flow of molding compound 15 may place undue stress on one or more bond wires 125. As the solder balls 105 are mounted later in the process, these stresses may manifest themselves as broken mounting feet 110 or broken bond wires 125. In an example process, using lead-free solder balls made of an SAC405 (SnAg 4.0, Cu 0.5) require higher mounting temperatures than those of traditional solder balls having a lead-based chemistry.

Figure 2A:
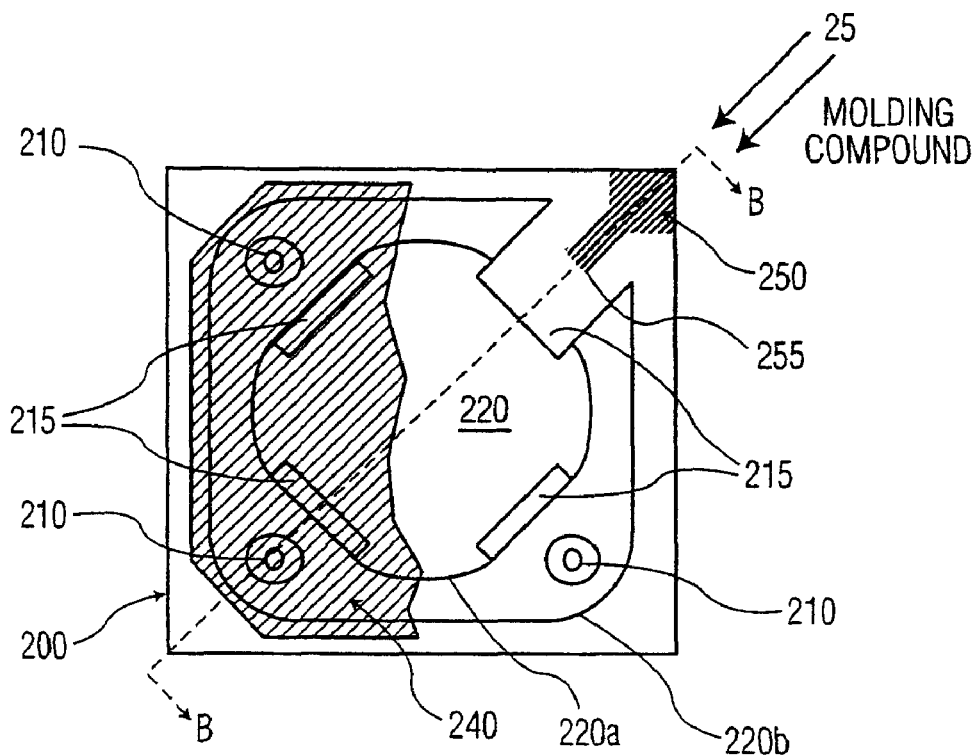
FIG. 2A depicts in top view an embodiment of a heat slug according to the present invention.
Figure 2B:
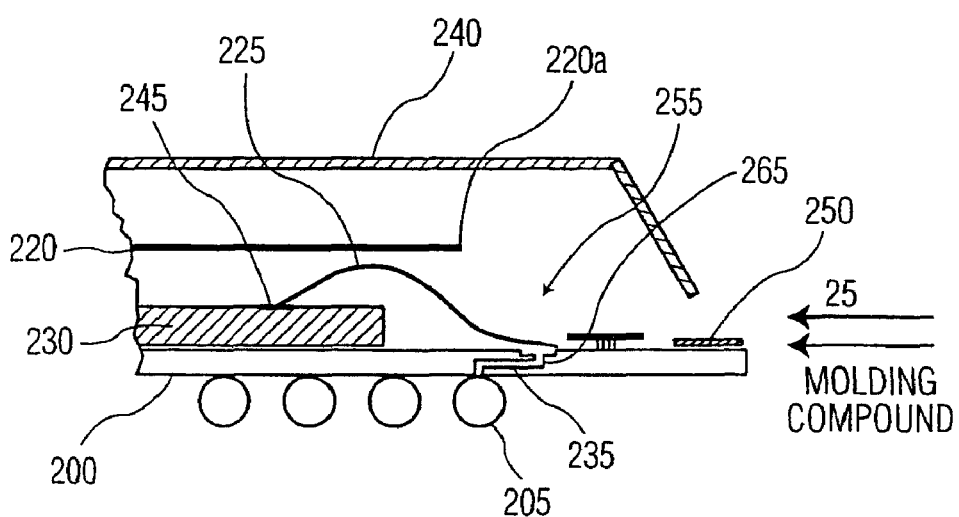
FIG. 2B is a cross-section of the heat slug of FIG. 2A.

Refer to FIG. 2A. In an example embodiment according to the present invention, a high performance ball grid array (HBGA) substrate 200 has a heat slug 220 mounted thereon. A single wire bond 225 is shown. An example lead count for an HBGA is 388 leads. Of course, these counts may be increased depending upon the IC device mounted therein. However, in other examples, HBGA may have upwards of 1000 or more bond wires providing electrical connection to the packaged IC device. There are three example mounting feet 210. One mounting foot 210 has been cut out 255. Corresponding through holes in the substrate 200 beneath the mounting feet 210 may be defined to provide attachment locations for the heat slug 200. On the substrate 200, there is a landing 250 from which the molding compound's flow begins into the heat slug 220 and mold 240. Refer to FIG. 2B. This cut out 255 enables molding compound 25 (guided by the mold 240) to flow more readily through via the three ports 215 to the IC device 230 encased by the heat slug 220. Stress on the bond wire 225 and IC device 230 is reduced. The bond wire 225 connects the IC 230 at a bonding pad 245 to a pad landing 265. The pad landing 265 through a conductive trace 235 in the substrate 200 is connected to a ball 205 of the ball grid array, providing electrical connection from the IC to the exterior of the substrate 200.

Figure 2C:
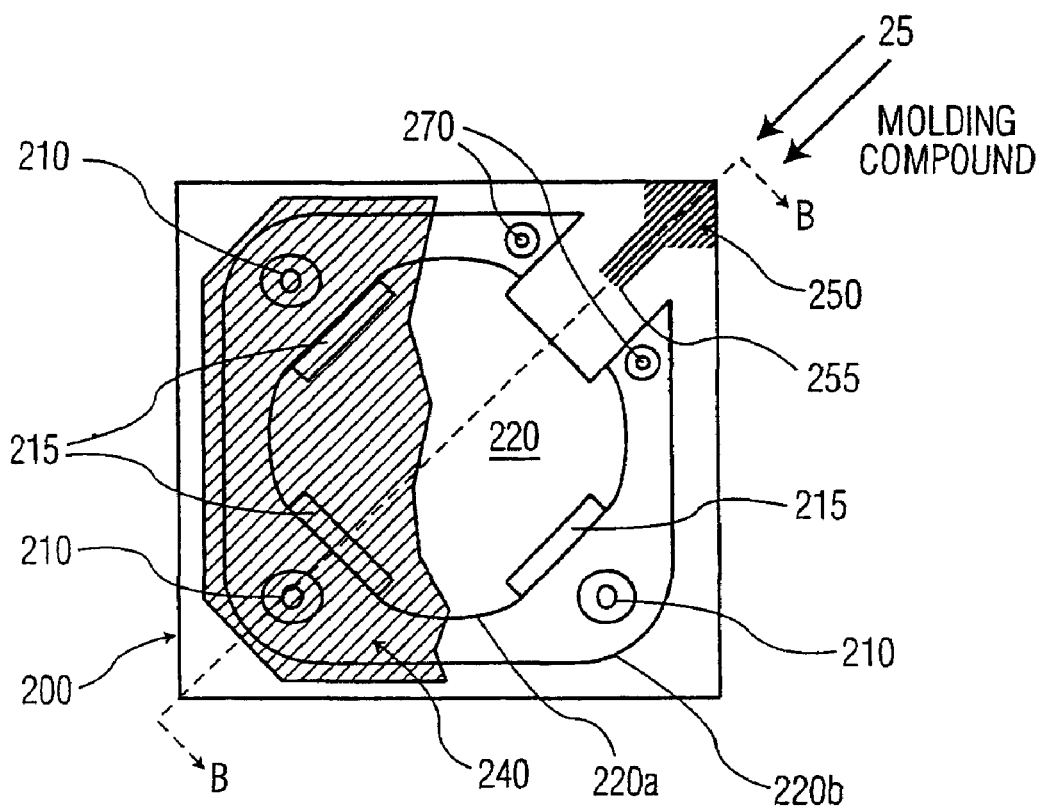
FIG. 2C depicts an example heat-slug similar to that of FIG. 2A but with additional mounting feet.

In another example embodiment, additional mounting feet may be included in the vicinity of the heat slug cutout. Refer to FIG. 2C. Mounting feet 270 near the cut out of the heat slug 220 may be included to provide additional attachment of the heat slug 220 to the substrate 200. On the substrate 200, corresponding locations beneath the mounting feet 210, 270 may be defined to provide so that the heat slug 220 may be attached.

Other example embodiments may include an additional cut out opposite the cutout 255 (FIG. 2A). Such a configuration would further facilitate the flow of molding compound during encapsulation.

Figure 3:
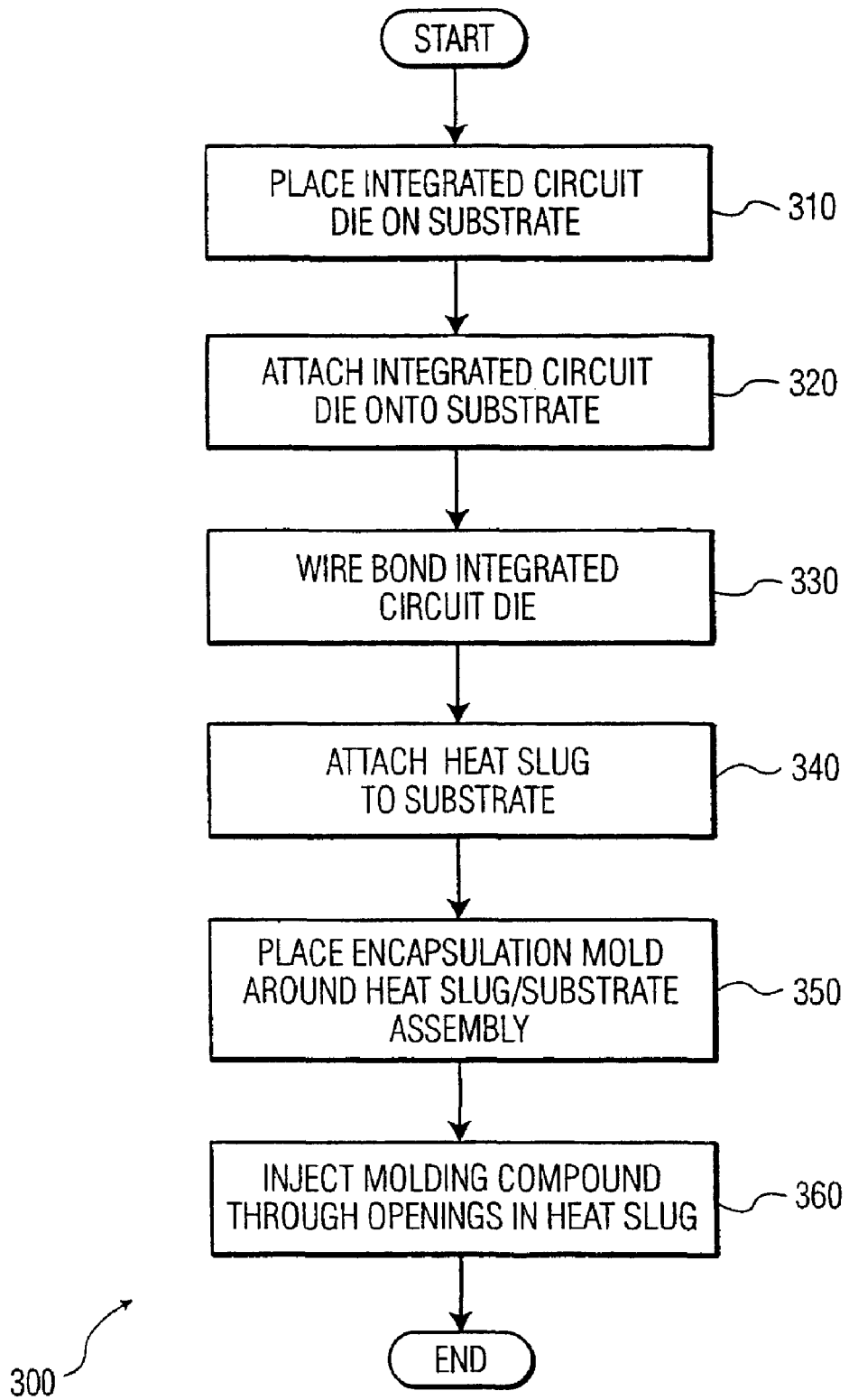
FIG. 3 depicts an example process packaging an IC with a heat slug.

FIG. 3 depicts an example process 300, in which the example embodiment shown in FIG. 2A and FIG. 2B may be used. The integrated circuit die is placed on a substrate 310. The integrated circuit die is attached on the substrate 320 with a process appropriate for the package. The integrated circuit die is wire bonded to the substrate 330. The heat slug according to an embodiment of the present invention is attached to the substrate 340. Via a mold that is placed over the heat slug, molding compound is injected through openings in the heat slug 350. The molding compound surrounds the heat slug; within the cavity defined by the heat slug, the wire bonded die is encapsulated.

While the present invention has been described with reference to several particular example embodiments, those skilled in the art will recognize that many changes may be made thereto without departing from the spirit and scope of the present invention, which is set forth in the following claims.

The invention claimed is:

1. A device comprising:
   at least one integrated circuit device (IC);
   a package substrate to which the at least one IC is connected;
   a heat slug having a plurality of positions for providing mounting feet; and
   a plurality of mounting feet for connecting the heat slug to the package substrate,
   wherein at least one position of the heat slug, but not all positions, does not include a mounting foot and
   wherein an opening is provided to a cavity between the heat slug and the package substrate, the opening being at the at least one position that does not include a mounting foot and being sized such that an encapsulating material can be provided through the opening.

2. The device of claim 1 wherein the at least one IC is positioned between the package substrate and the heat slug and the encapsulating material is a mold compound used to at least partially encapsulate the at least one IC.

3. The device of claim 1 wherein the heat slug has four symmetrical positions and there are mounting feet connected to three of the positions.

4. The device of claim 1 wherein the at least one IC includes a plurality of bonding pads and the package substrate includes a plurality of pad landings, the device further comprising:
   a plurality of conductive wires connecting the IC bonding pads to the pad landings.

5. The device of claim 1, wherein a height of the opening is approximately equal to a height of the cavity between the heat slug and the package substrate.

6. A device comprising:
   at least one integrated circuit device (IC);
   a package substrate on which the at least one IC is connected;
   a heat slug connected to the package substrate and forming a cavity between the heat slug and the package substrate;
   a large opening and a plurality of small openings at a perimeter between the heat slug and the package substrate, wherein the large opening is sized such that mold compound can flow through the larger opening; and
   mold compound at least partially filling the openings and the cavity.

7. The device of claim 6 wherein the at least one IC is positioned in the cavity.

8. The device of claim 6 further comprising:
   a plurality of mounting feet connected between the heat slug and the package substrate, wherein the plurality of small openings are arranged between mounting feet.

9. The device of claim 8 wherein the large opening displaces a location otherwise adapted for one of the plurality of mounting feet.

10. The device of claim 6 wherein the package substrate provides external connections for a high performance ball grid array package structure.

* * * * *